United States Patent [19]

Benyon, Jr. et al.

[11] 4,313,809
[45] Feb. 2, 1982

[54] METHOD OF REDUCING EDGE CURRENT LEAKAGE IN N CHANNEL SILICON-ON-SAPPHIRE DEVICES

[75] Inventors: Carl W. Benyon, Jr., Trenton; John J. O'Neill, Jr., Belle Mead, both of N.J.

[73] Assignee: RCA Corporation, New York, N.Y.

[21] Appl. No.: 197,286

[22] Filed: Oct. 15, 1980

[51] Int. Cl.³ ............................................. C23C 15/00
[52] U.S. Cl. ................................. 204/192 C; 29/571; 156/656; 156/657; 156/665; 357/23
[58] Field of Search ..................... 204/192 C; 29/571; 357/23; 156/656, 657, 665

[56] References Cited

U.S. PATENT DOCUMENTS 3,890,632  6/1975  Ham et al. ........................... 357/23
4,111,775  9/1978  Hollis, Jr. et al. .............. 204/192 C Primary Examiner—Aaron Weisstuch
Attorney, Agent, or Firm—Birgit E. Morris; Donald S. Cohen; Lawrence P. Benjamin

[57] ABSTRACT

A novel process for improving the operation of silicon-on-sapphire devices by removing or minimizing edge current leakage. The reduction in leakage current is accomplished by subjecting the completed device to a sputtering operation and depositing thereon a layer of, for example, aluminum which is subsequently removed prior to scribing and dicing.

6 Claims, 2 Drawing Figures

METHOD OF REDUCING EDGE CURRENT LEAKAGE IN N CHANNEL SILICON-ON-SAPPHIRE DEVICES

BACKGROUND OF THE INVENTION

This invention relates to semiconductor processing and, more particularly, to a novel process for improving the operation of silicon-on-sapphire devices by removing or minimizing edge current leakage.

Instabilities, such as excessive leakage current with zero applied gate voltage, has been a significant source of rejects in certain Silicon-On-Sapphire (SOS) Field Effect Transistors (FET's) since SOS/FET devices were first used in high density configurations. These instabilities were especially noticeable after the FET's were operated at temperatures in excess of about 150° C. and, for the most part, this leakage appears most frequently in N-channel SOS/FET devices. Further, this excessive leakage manifested itself by premature "turn-on" in addition to the relatively high source-drain leakage currents.

In U.S. Pat. No. 3,890,632, STABILIZED SEMICONDUCTOR DEVICES AND METHOD OF MAKING SAME which issued to W. E. Ham et al. on June 17, 1975 and is assigned to the same assignee as the subject application there is described and claimed a novel stabilized semiconductor device and method which substantially overcomes the aforementioned disadvantages by introducing conductivity modifiers into selected edge regions of the channel region. In that patent, a mesa of single-crystal semiconductor device is formed on an insulating substrate such as sapphire. Since the silicon islands have traditionally been formed using an anisotropic etch, the resulting mesa or island will have side surfaces extending transversely from the substrate as well and a channel region that extends from one side surface to its corresponding opposite side. The invention therein teaches the selective doping of the edge regions of the channel region, adjacent the opposite side surfaces, in order to introduce more conductivity modifiers into the edge regions than the remainder of the channel region. The net result is a marked increase in threshold voltage levels in the doped regions which significantly reduces leakage current.

SUMMARY OF THE INVENTION

In accordance with the teachings of our invention, a process is described for fabricating a silicon-on-sapphire semiconductor device wherein the leakage current is significantly reduced. This reduction in leakage current is accomplished after the device is formed and, preferably, prior to the time the wafer is scribed and diced by providing the device with a layer of aluminum, such as by sputtering, and thereafter removing the aluminum layer.

DETAILED DESCRIPTION OF THE INVENTION

Figure 1:
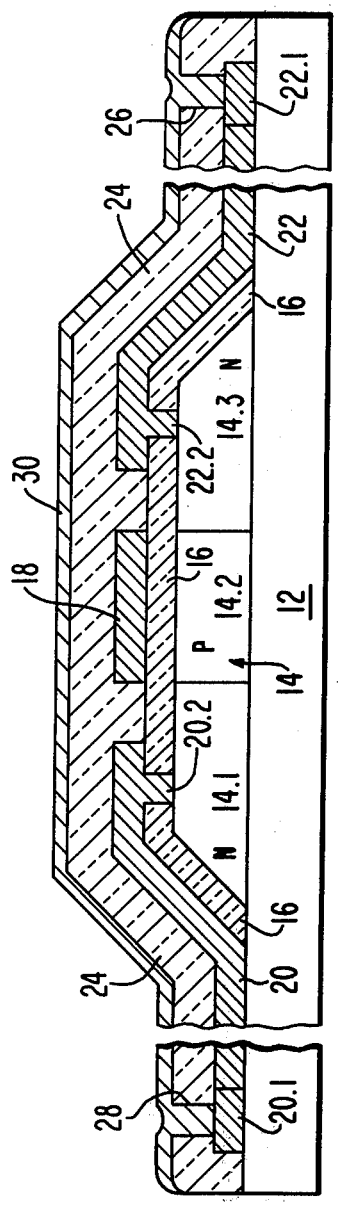
FIG. 1 is a cross-sectional view of a typical MOS transistor indicating the application of the metal layer, in accordance with the teaching of the present invention.

Referring now to FIG. 1, there is shown a classic SOS/MOS device wherein a sapphire substrate 12 has an island of single crystalline silicon 14 deposited thereon. Silicon island 14 has been formed by the usual anisotropic etch of a continuous layer and is subject to excessive leakage current due to the presence of the [111] edge surface of the silicon island. It is the [111] edge surface that "turns" on with gate voltage, before the top surface of the device which has the more desirable [100] crystallographic orientation. As is usual in the art, after island 14 has been defined and etched, it is provided with a layer of gate oxide 16 which covers the entire island. Thereafter, in order to form an aligned gate device, either a polycrystalline silicon or aluminum gate 18 is formed after which source region 14.1 and drain region 14.3 are formed in the body 14 as, for example, by ion implantation. The intervening portion of island 14, masked by gate member 18, represents channel region 14.2. In this example, island 14 was initially doped with, for example, boron as a P-type conductivity modifier while the implanted regions 14.1 and 14.3 are implanted with phosphorus or the like to form N type conductivity source and drain regions 14.1 and 14.3.

Thereafter, the gate oxide layer is provided with openings to expose contact openings after which aluminum contacts and interconnects are formed. Interconnect 20 may, for example, be aluminum and extend from source region 14.1 at which point an ohmic contact is made as shown at 20.2, to its termination at pad 20.1. Similarly, the drain region 14.3 has an aluminum interconnect 22 which interconnects pad 22.1 with ohmic contact 22.2 at drain region 14.3. In this embodiment, we show, by way of example, a doped polycrystalline silicon gate line 18 which may, for example, either extend to another or adjacent device (not shown) or may terminate at the interface of the side edge of island 14 and substrate 12 in which event contact may be made at this point and a metal interconnect provided which would then extend to a pad or extend to another device.

After having formed the individual devices on the wafer, the wafer is provided with a passivating layer 24 which usually consists of either a phosphosilicate glass or nitride layer or any combination thereof which acts as a protective means to prevent corrosion. At this point, contact openings 26 and 28 are formed in passivating layer 24 in order that leads may be attached thereto after the wafer, on which this and other similar devices are formed, has been scribed and diced.

Having processed the wafer or individual device to the point where it is ready to be scribed and diced, that is, prior to being mounted and having leads attached to the contact openings at each pad, we propose that the device be placed in a sputtering system and overcoated with aluminum to a thickness of about 1 micrometer. This aluminum overcoat is shown as layer 30 and it should be noted that the aluminum coating extends into contact openings 26 and 28. It is theorized that the sputtering process introduces a charge to the [111] edge surface of island 14 which maintains the n-channel devices that have been manufactured thereon in a "turned off" state during "0" gate voltage condition. By keeping the [111] edge in a turned off state, the n-channel transistors will not conduct until the [100] surface portion of the transistor turns on. The elimination of the [100] edge turn on lowers the n-channel off-state leakage by about an order of magnitude.

To accomplish this improvement, it is proposed that the completed wafer be placed in a sputtering system which is then pumped down to a vacuum of about $2.5 \times 10^{-7}$ torr. Thereafter, an inert gas such as argon is introduced into the chamber and the chamber pump throttled back so as to maintain a pressure therein of about 2.5 millitorr. The wafer is then connected to a constant current, D.C. power supply and maintained at a voltage of about $470 \pm 10$ volts. Under these circumstances a constant current is maintained at about 4.6 A. The aluminum is deposited at a rate of about 160 angstroms per minute for a sufficient length of time to deposit about 1 micrometer (10,000 angstroms) of aluminum on the wafer. By way of example, the above parameters can be maintained in a device manufactured by VARIAN and identified as a "S-Gun ® Thin Film Source".

After having deposited 1 micrometer (10,000 angstroms) of aluminum the wafer is then removed from the deposition chamber and subjected to an etching step which removes all of the deposited aluminum. Thus, all of aluminum layer 30 as well as the aluminum that has been deposited in contact openings 26 and 28 has been removed and the wafer has been restored to its original physical state before the deposition of the layer except for the charge that has been placed on the device edges. The wafer may now be scribed and diced and mounted in an appropriate enclosure.

Figure 2:
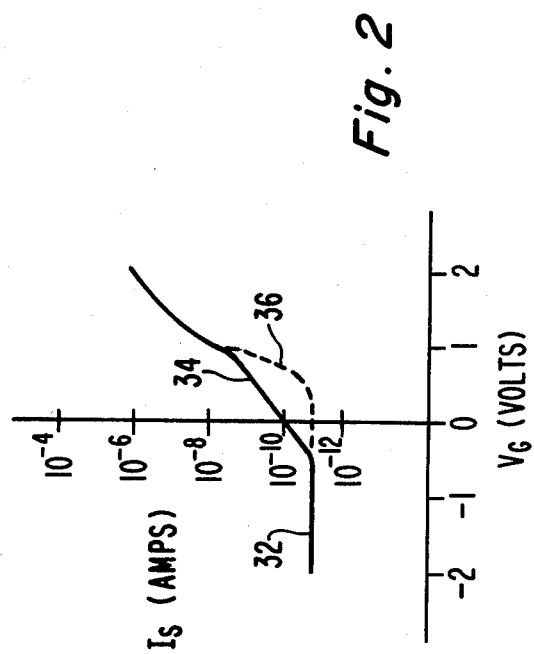
FIG. 2 is a plot of gate voltage versus leakage current of a device constructed in accordance with the teachings of the present invention and which shows the improvement achieved by using the novel process.

Referring now to FIG. 2 there is shown a typical plot of source current ($I_S$) versus gate voltage ($V_G$) characteristics of an SOS n-channel device both before and after the above-described treatment. The portion of the curve labelled 32 indicates the extremely low current flow when the gate voltage $V_G$ is below about $-1.0$ volt. In an untreated n-channel device it is seen that, as $V_G$ increases from $-1.0$ to $-0.5$ volts the leakage current $I_S$ increases markedly and, as shown both in FIG. 2 and in the accompanying table, by the time $V_G$ approaches zero volts, the leakage current is about $2.2 \times 10^{-10}$ A. Industry standards have placed the normally accepted threshold voltage of the transistor at that gate voltage ($V_G$) that produces about $10^{-6}$ A of gate-drain current flow and the current referred to herein is the subthreshold leakage current occurring at about $10^{-10}$ amperes with zero volts on gate ($V_G$). Any reduction of current in this range will thus enhance the useful life of battery powered power supplies by reducing the off-state power drain. This low portion of curve 32 becomes an upwardly sloping ramp 34 until $V_G$ reaches about 1.0 volt and, thereafter, rises rather dramatically. However, this rise is not undesirable since, at this point, the device is turned on and is thus conductive. We have found that after the treatment previously described a marked reduction occurs in the leakage current as shown by the dotted portion of the curve labelled 36 and the following table of measured parameters.

In the following table the leakage current was plotted by applying a voltage $V_G$ to the gate which voltage is varied from $-2.0$ to $+2.0$ volts while the drain region was connected to a constant voltage source of about $+1.0$ volt. The current flowing through the source ($I_S$) was measured at the various gate voltages $V_G$ to obtain the results.

| $V_D = 1.0$ V | | | |
|---|---|---|---|
| Before Sputtering | | After Sputtering | |
| $V_G$ | $I_S$ | $V_G$ | $I_S$ |
| $-2.0$ | $1.5 \times 10^{-11}$ | $-2.0$ | $1.3 \times 10^{-11}$ |
| $-1.5$ | $1.6 \times 10^{-11}$ | $-1.5$ | $1.3 \times 10^{-11}$ |
| $-1.0$ | $2.2 \times 10^{-11}$ | $-1.0$ | $1.4 \times 10^{-11}$ |
| $-0.5$ | $6.0 \times 10^{-11}$ | $-0.5$ | $1.6 \times 10^{-11}$ |
| 0 | $2.2 \times 10^{-10}$ | 0 | $2.2 \times 10^{-11}$ |
| $+0.5$ | $1.8 \times 10^{-9}$ | $+0.5$ | $2.7 \times 10^{-10}$ |
| $+1.0$ | $4.0 \times 10^{-8}$ | | $3.8 \times 10^{-8}$ |
| $+1.5$ | $1.2 \times 10^{-6}$ | $+1.5$ | $1.2 \times 10^{-6}$ |
| $+2.0$ | $7.0 \times 10^{-6}$ | $+2.0$ | $7.0 \times 10^{-6}$ |

Thus, it should now be apparent that after subjecting the wafer to the above described processing, the zero gate voltage leakage current has been reduced by one order of magnitude from about $2.2 \times 10^{-10}$ to about $2.2 \times 10^{-11}$. This constitutes a significant reduction in leakage current with a concomitant saving in power.

While the foregoing exegesis described our novel process for reducing the zero voltage leakage current in terms of a completed wafer having contact openings formed in the passivating layer, it should now be obvious to those skilled in the art that our novel process may be applied with equal utility to a wafer immediately prior to the formation of the contact openings.

Further, while the substrate has been described as being sapphire, it should also be obvious that other, similar insulating substrates may be used in place thereof. Such other insulating substrates may be either spinel or monocrystalline aluminum oxide. Thus, any prior reference to SOS should include these last mentioned alternatives for sapphire.

What is claimed is:

1. In a process for reducing the zero gate voltage leakage of an MOS device, wherein a plurality of devices are initially formed on a wafer of insulating material, each device having source and drain regions, first and second interconnecting leads in ohmic contact with respective source and drain regions, third interconnecting leads capacitively coupled to respective channel regions, and a passivating layer covering each of the devices on the wafer, the improved process comprising the steps of:

sputtering a layer of metal on the passivating layer completely covering each device on the wafer; and
removing the sputtered layer.

2. The process of claim 1, wherein:
the sputtered layer of metal is aluminum.

3. The process of claim 2, wherein:
the insulating substrate is selected from the group consisting of sapphire, monocrystalline aluminum oxide and spinel.

4. The process of claim 3, wherein:
the aluminum layer is sputtered to a thickness of about 1 micrometer.

5. The process of claim 4 comprising the further steps of:
performing the step of sputtering in an inert atmosphere maintained at about 2.5 millitorr.

6. The process of claim 5, wherein:
the aluminum is deposited at a rate of about 160 angstroms/min.

* * * * *